ADJUSTABLE INDUCTANCE DEVICE

Filed Dec. 18, 1951 2 Sheets-Sheet 1

INVENTORS R. S. DUNCAN
H. A. STONE, JR.
BY
ATTORNEY

Nov. 1, 1955 R. S. DUNCAN ET AL 2,722,664

ADJUSTABLE INDUCTANCE DEVICE

Filed Dec. 18, 1951 2 Sheets-Sheet 2

INVENTORS R. S. DUNCAN
H. A. STONE, JR.

BY [signature]

ATTORNEY

United States Patent Office 2,722,664
Patented Nov. 1, 1955

2,722,664

ADJUSTABLE INDUCTANCE DEVICE

Robert S. Duncan, Orange, and Henry A. Stone, Jr., Bernardsville, N. J., assignors to Bell Telephone Laboratories, Incorporated, New York, N. Y., a corporation of New York Application December 18, 1951, Serial No. 262,248

11 Claims. (Cl. 336—133)

This invention relates to inductance devices and more particularly to adjustable or tunable inductors.

In a number of applications, for example in low-current level circuits, it is highly desirable that the inductors employed have a high figure of merit, Q, and also be adjustable over a wide range of inductance values. It is further desirable that the inductors be accurately adjustable over this wide range to allow the circuit to be tuned to within precise limits, for example to within plus or minus 5 cycles of a desired frequency in the 30- to 200-kilocycle frequency range. The inductor advantageously should be compact in size and consist of parts which may be easily manufactured. The adjusting mechanism of the inductor should be simple in construction and operation, while allowing accurate tuning with a simple tool.

In the past, tuning of inductors has been accomplished by various methods. One such method is to incorporate a fixed air gap in the magnetic circuit of an inductor and to insert a magnetic adjusting or tuning member into the air gap to reduce its length. The result is to increase the inductance as the magnetic member is inserted into the air gap; however, this method of tuning requires precise adjustment of a small tuning member in the confined space of the air gap. The variation of inductance with respect to travel of the tuning member tends to be exponential rather than the more desirable linear. Also, flux concentrations in the tuning member greatly reduce the Q of the inductor.

A second method of variation of the inductance of a tunable inductor is to vary the length of an air gap by moving its adjacent surfaces relative to each other. This, however, requires a mechanical adjustment which will vary the air gap but a few mils over the entire range of adjustment and the change in inductance with respect to mechanical adjustment is definitely exponential.

A third method of adjusting the inductance is to vary the number of turns on the coil, but this type of adjustment is not readily adaptable to closed-core inductors with simple adjusting means.

One general object of this invention is to improve the structure and the performance characteristics of adjustable inductance devices.

More specific objects of this invention are to facilitate the adjustment of variable inductors, to increase the tuning range of such devices, to obtain a substantially linear relation between inductance and tuning element displacement and to realize a high Q inductor of minimum overall size for prescribed requirements.

In one specific embodiment illustrative of the invention, an inductor comprises a coil wound on a cup-shaped core member of magnetic material advantageously of crystalline magnetic material known as ferrite, which is axially aligned within a cylindrical shell also of magnetic material and which has a central aperture at one end. The rim of the cup-shaped core member and the inside surface of the shell adjacent the aperture defines an air gap of fixed length. A tuning member or cylinder likewise of magnetic material, is affixed to an adjusting screw which is supported by a terminal plate attached to the apertured end of the shell. The tuning cylinder is adjustable through the aperture in the shell downward into the recess of the cup-shaped central core member.

A feature of this invention involves the provision of a parallel magnetic circuit comprising a fixed reluctance path including an air gap, and a variable reluctance path through a tuning member, tuning being accomplished by the shunting effect of the tuning member.

Another feature of this invention relates to provision of a tuning cylinder which is adjustable near an air gap in the fixed reluctance path so that flux is shunted from the air gap through the tuning cylinder as it is adjusted in the direction of the length of the air gap.

A further feature of this invention entails a tuning mechanism in which the tuning cylinder is capable of traveling near the air gap a distance of several times the length of the air gap to gradually shunt the flux at that air gap so that the inductor has a smooth variation in inductance.

Still another feature of this invention pertains to the correlation of certain parameters of the magnetic structure to produce an optimum ratio of direct-current resistance to volume for the inductor. Significant among these parameters, discussed hereinafter, are "R," the outside radius of the shell member; "PR," the radius of the central core member expressed in terms of outside radius, "R," multiplied by a radius factor "P"; the combined heights of shells, "HR," expressed in terms of the outside radius, "R," multiplied by the height factor "H"; and finally the thickness of the shell members, "*t*."

A more complete understanding of the invention and the various features thereof may be gained from the following detailed description and the accompanying drawings, in which:

Fig. 1 is a front elevation in partial section of an inductor illustrative of one embodiment of this invention;

Figs. 2A, 2B, and 2C are diagrammatic illustrations of a vertical section of the inductor of Fig. 1 showing the tuning member in three different positions and the changes in the flux paths with movement of the tuning member;

Figure 5:
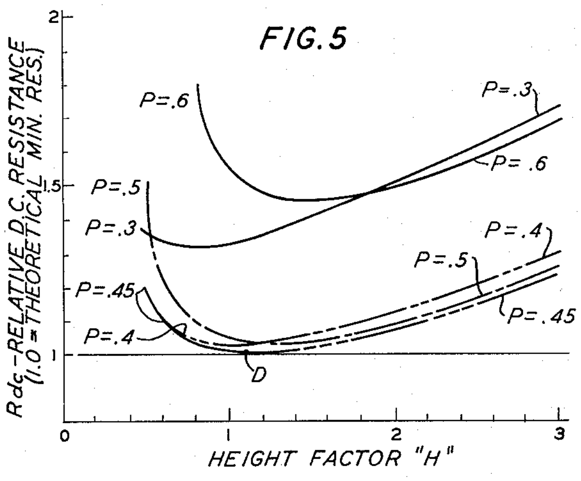
Figure 6:
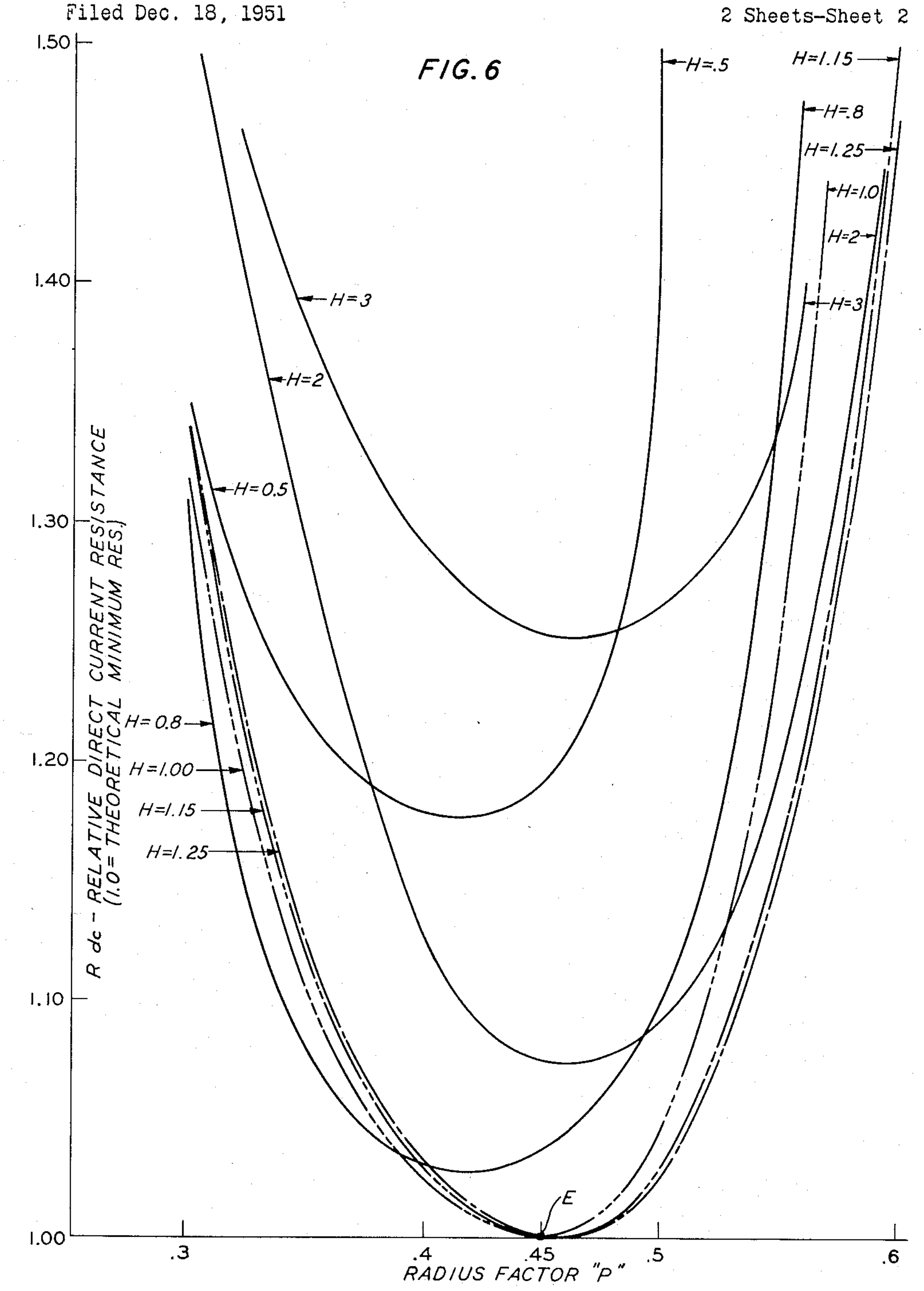

Fig. 5 is a graphical representation of the variation of direct-current resistance in the inductor as the height of the shell members in structures having cores of several configurations, is varied as evidenced by the variation in the height factor "H"; and Fig. 6 is a graphical representation of the variation of direct-current resistance in the inductors as the radius factor is varied while the height factor H, of the shells, remains constant, for several core shapes.

Figure 1:
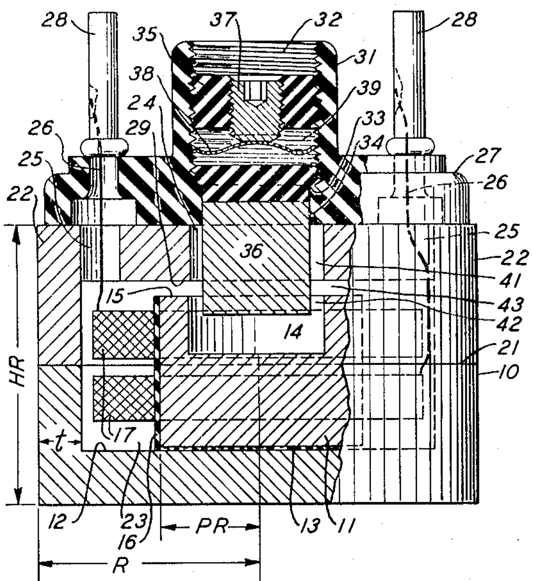

In the device illustrated in Fig. 1, a cylindrical shell 10 of magnetic material, such as manganese-zinc ferrite, supports a central core member 11 also of magnetic material, such as manganese-zinc ferrite. The central core member 11 is secured to an insulating, e. g. paper, disc 13 which is cemented to the bottom surface 12 of the shell 10 with the paper disc 13 providing an air gap between the shell 10 and the central core member 11. In the upper surface of the central core member 11 is a recess 14 projecting inwardly from the annular surface 15. Surrounding the central core member 11 is an insulating tube 16 upon which are wound coils 17. Two duolateral coils may be employed in the specific embodiment of this invention illustrated but, of course, a different number and type may be employed.

Cemented to the upper edge of the shell 10 in an opposed position is a similar shell 22, also of magnetic material, having a central aperture 24 therein. The two shells enclose a hollow chamber 23 wherein the core member 11 and coil assembly are located. Two apertures 25 are located in shell 22 through which leads 26 for the coils 17 pass. Attached to the outer apertured surface of the shell 22 is a terminal plate 27 of insulating material which supports terminals 28. The terminal plate 27 has a central raised portion 31 having therein a threaded opening 32. At the end of the threads of opening 32 is located a shoulder 33. An aperture 34 penetrates the remaining thickness of the terminal plate and is axially aligned with the aperture 24 and the recess 14. An adjusting screw 35 of non-conducting, non-magnetic material engages the threads of the aperture 32 and supports a tuning cylinder 36 of magnetic material. Contained within adjusting screw 35 is a locking device consisting of a set screw 37 and a spring strip 38 which lies in a transverse opening 39.

The tuning cylinder 36 is adjustable along the axis of the shells 10 and 22 and the central core member 11, through the central aperture 24 of shell 22 and into the recess 14. The curved surface of the tuning cylinder and the corresponding surface of the central aperture 24 define an air gap 41 while the same curved surface of the tuning cylinder and the side of the recess 14 define a variable air gap 42. The annular surface 15 of core member 11 and the inner surface 29 of shell 22 define a fixed air gap 43.

The inductor has a definite minimum inductance value with the tuning cylinder 36 withdrawn from the chamber 23. This value depends upon the coil and the fixed magnetic circuit through the shells and central core member and air gaps therebetween. As the tuning cylinder is moved downward in Fig. 1 the variable air gap 42 decreases in reluctance offering a shunt path for the flux. Due to the decrease in reluctance of the total effective air gap, fixed gap 43 in parallel with variable gap 42, the inductance value of the inductor increases. When the desired inductance or circuit condition results, the tuning cylinder may be locked in place to maintain that condition indefinitely. Locking is accomplished by tightening the set screw 37. This action elongates the spring strip 38 and its ends engage threads in the terminal plate 27 preventing movement of the adjusting screw 35 and the suspended tuning cylinder 36.

Figure 2A:
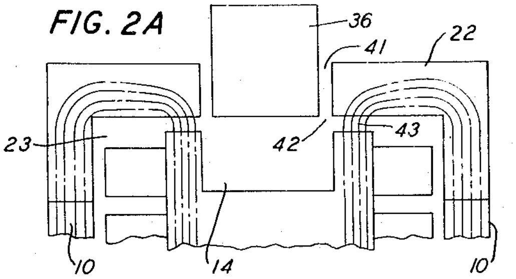
Figure 2B:
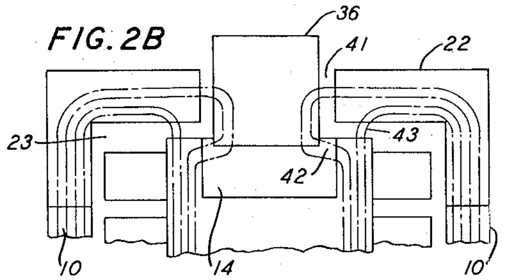
Figure 2C:
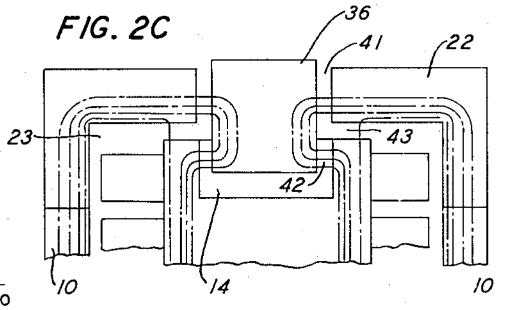

The effects of adjustment of the tuning cylinder are illustrated in Figs. 2A, 2B, and 2C. In Fig. 2A, the tuning cylinder 36 is withdrawn completely from the recess 14 so that the path of magnetic flux is around the outer shells 10 and 22, through air gap 43 and central core member 11. As the tuning cylinder moves into recess 14, part of the flux is then shunted through air gap 41, the tuning cylinder 36 and the air gap 42, with the remaining part following the fixed path through the air gap 43. As the tuning cylinder is moved downward, the shunt path decreases in reluctance gradually to the point where nearly all the flux passes through the tuning cylinder and the inductance approaches the top of the effective range.

Figure 3:
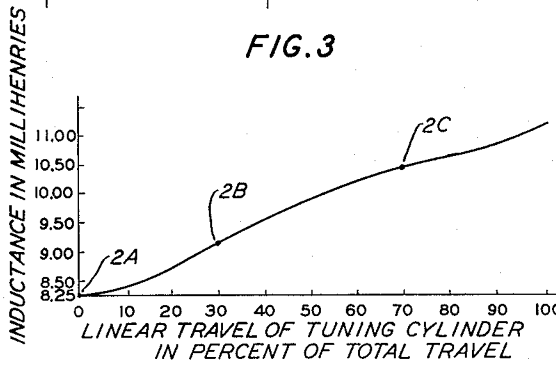
Fig. 3 is a graphical representation of the change in inductance with respect to the linear travel of the tuning member, points 2A, 2B, and 2C corresponding to inductance values with the tuning plug in the positions illustrated by Figs. 2A, 2B, and 2C, respectively.

Fig. 3 is a graphical illustration of the operation of the device and indicating some of its advantages. The graph shows a very broad variation of inductance of the inductor as it is tuned, the variation being over a range of approximately 15 per cent on either side of a mean inductance value. The inductance value varies substantially linearly with the mechanical adjustment at a rate of approximately 0.1 per cent per mil of tuning cylinder travel over the broad range noted. In a typical structure, travel of the tuning cylinder during an adjustment over the entire range is between 250 and 300 mils or between 6 and 8 times the length of the fixed air gap 43. By employing threads of 24 turns to the inch on the adjusting screw 35, over 6 turns of the screw are possible for the complete range of adjustment. Such a broad mechanical adjustment range along with linear inductance variation make possible tuning to within $\frac{1}{100}$ of 1 per cent of a desired inductance value.

The inductance of the unit increases rapidly as the tuning cylinder approaches the central core member for then the flux path ceases to be through air gap 42 and instead flows between the bottoms of the tuning cylinder 36 and the recess 14. Since it is usually desired to employ only the linear portion shown in Fig. 3 of the inductance curve and yet to remove the danger of the tuning cylinder 36 striking the central core member 11 from over-adjustment, the fixed shoulder stop 33 may be replaced by an adjustable one which can be positioned so that the entire linear range and only that range of inductance values may be used.

Figure 4:
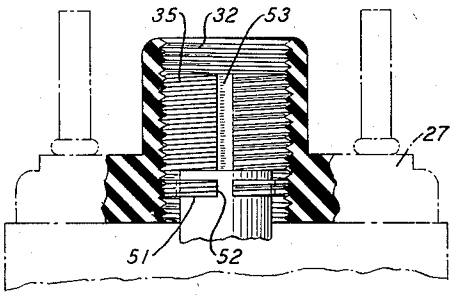
Fig. 4 is a partial section of an embodiment of this employing an alternative adjusting detail.

In Fig. 4 showing an alternative adjusting device for the inductor of Fig. 1, the threaded opening 32 extends through the terminal plate 27. Engaging its threads are the external threads of a split ring 51. A slot 52 in the ring 51 corresponds to a groove 53 of the adjusting screw 35. Using a special screwdriver with a thin offset blade, the ring 51 and the adjusting screw 35 may be driven downward until the lowest point of desired adjustment. Then the special screwdriver may be withdrawn and the adjusting screw rotated alone. The ring 51 should be slightly oversize so that it will remain in position as a shoulder stop until moved in the manner in which it was inserted.

To achieve the highest Q possible in an inductor for applications in the frequency range of about 30–200 kilocycles, it is advisable to employ ferrite core members and to form these members with the relative dimensions which will give the lowest ratio of direct-current resistance to volume for a given inductance.

In inductor cores comprising an outer cylindrical shell and an axial post both of magnetic material and an air gap somewhere in the magnetic circuit, the optimum relative dimensions are as follows: The height of the cylindrical shell should be between 1.0 and 1.25 times the external radius of the shell and radius of the center post should be between 0.4 and 0.5 of the external radius of the shell. In a theoretical determination of these dimensions it is assumed that the flux distribution is uniform within the core and that the air gap does not concentrate the flux unduly.

In the determination, the following relationships are noted:

$$t \equiv \text{thickness of shell is given by } (R-t)=R\sqrt{1-P^2} \quad (1)$$

$$\text{Magnetic cross-section} \equiv A=\pi P^2R^2 \quad (2)$$

$$\text{Mean magnetic path}=l=R(3\sqrt{1-P^2}-1+2H) \quad (3)$$

$$\text{Cross-section of winding area} \equiv w=(R^2(\sqrt{1-P^2}-P))(2\sqrt{1-P^2}-2+H) \quad (4)$$

$$\text{Mean length of turn} \equiv \lambda=\pi R(\sqrt{1-P^2}+P) \quad (5)$$

$$\text{Coil volume} \equiv V=\pi R^3H \quad (6)$$

In determining the relationship between the inductance, turns and flux density, the reluctance of a magnetic core of uniform cross section, with an air gap, is $$\text{Rel.}=\frac{l+\mu_m g}{\mu_m A}=\frac{l}{\mu A} \quad (7)$$

where "Rel." is the reluctance
"$g$" is the effective length of air gap
"$\mu_m$" is the permeability of the core material
"$\mu$" is the effective permeability of the core plus air gap.

The magnetomotive force due to current I in a winding of N turns on such a core is $$M.M.F.=.4\pi NI \quad (8)$$

and the magnetic flux, Φ, in the coil is $$\Phi=\frac{MMF}{\text{Rel.}}=\frac{.4\pi NA\mu I}{l} \qquad (9)$$

The voltage, E, induced by this flux is $$E=L\frac{di}{dt}=N\frac{d\Phi}{dt}=\frac{.4N^2A\mu}{l}\frac{di}{dt}ab\text{ volts}=\frac{4\pi N^2A\mu 10^{-9}}{l}\frac{di}{dt}\text{volts} \qquad (10)$$

From which the inductance, L, is seen to be $$L=\frac{4\pi N^2A\mu 10^{-9}}{l}\text{ henries} \qquad (11)$$

The maximum flux density, $B_m$, (for sinusoidal current) is $$B_m=\sqrt{2}\frac{\Phi}{A}=\frac{.4\sqrt{2}\pi N\mu I}{l}\text{ gausses} \qquad (12)$$

If PR, R and HR in Equations 2 and 3 are expressed in centimeters, $$L=2(1.97)N^2\mu 10^{-8}\frac{\pi P^2R}{3\sqrt{1-P^2}-1+2H}\text{ henries} \qquad (13)$$

or $$N=\frac{\frac{0.712}{\sqrt{2}}L^{1/2}10^4}{\mu^{1/2}}\sqrt{\frac{3\sqrt{1-P^2}-1+2H}{\pi P^2R}} \qquad (14)$$

and $$B_m=\frac{1.78\mu NI}{l}=\frac{0.895\mu^{1/2}L^{1/2}I10^4}{\pi^{1/2}PR^{3/2}\sqrt{3\sqrt{1-P^2}-1+2H}}\text{ gausses} \qquad (15)$$

The direct-current resistance may be determined as a function of P and H. The direct-current resistance of the coil is $$R_{dc}=\frac{\rho}{K_w}\frac{\lambda N}{\frac{w}{N}}=\frac{\rho N^2\lambda}{K_w w} \qquad (16)$$

in which $\rho$ is the resistivity of the wire, and $K_w$ is the ratio of total conductor cross section to available winding cross section, $w$. Subsituting the values of N, λ and $w$, given by Equations 14, 5, and 4, respectively, into Equation 16

$$R_{dc}=\frac{\frac{5.06}{2}L\rho 10^7}{K_w\mu}\frac{(\sqrt{1-P^2}+P)(3\sqrt{1-P^2}-1+2H)}{P^2R^2(\sqrt{1-P^2}-P)(2\sqrt{1-P^2}-2+H)} \qquad (17)$$

Of prime interest are the effects of changes in P and H in an inductor whose coil volume, V, will remain constant. By substituting from Equation 6, the variable R may be eliminated.

$$R_{dc}=K_{dc}\frac{(\sqrt{1-P^2}+P)(3\sqrt{1-P^2}-1+2H)H^{2/3}}{P^2(\sqrt{1-P^2}-P)(2\sqrt{1-P^2}-2+H)} \qquad (18)$$

where $$K_{dc}=\frac{\frac{5.06}{2}\rho 10^7\pi^{2/3}L}{K_w\mu V^{2/3}} \qquad (19)$$

Graphical solutions of the above equation for $R_{dc}$ are found in Figs. 5 and 6. Fig. 5 shows the change of the direct-current resistance with the variation in the heights of the shell members in several inductors where the post-shell radii ratio remains constant. Each of the curves shows a minimum value of direct-current resistance. The minimum point varies also with each of the different inductors. This determination permits the design of an inductor with the lowest possible direct-current resistance by employing the optimum value for both the height and radius factors. The lowest direct-current resistance for both of these design criteria appears at point D of Fig. 5. At that point the lowest curve, $P=0.45$, reaches its lowest value where the height factor H is equal to 1.10 and the range of P values from 0.4 to 0.5 with H equal to values from 1.0 to 1.25 constitutes the optimum core shape limits.

Fig. 6 is a graphical illustration of the variation in direct-current resistance in several inductors with fixed height factors as the radius factor P is varied. The point of lowest direct-current resistance appears on the curve, H equals 1.10 at point E, where P equals 0.45. Point E corresponds to point D in Fig. 5.

It is understood that the above-described arrangements are illustrative of the application of the principles of the invention. Numerous other arrangements may be devised by those skilled in the art without departing from the spirit and scope of the invention.

What is claimed is:

1. An inductance device comprising a shell of magnetic material, a post of magnetic material within said shell and defining an air gap therewith, said shell, post and air gap defining a prescribed reluctance magnetic path, a coil magnetically coupled to said post, and a tuning member of magnetic material adjustable within said shell adjacent the air gap between said shell and said post in a direction generally parallel to the length of said air gap, said tuning member being substantially larger in dimensions than said air gap and defining a variable reluctance magnetic path around the air gap in the prescribed reluctance magnetic path.

2. An inductance device comprising a shell of magnetic material, a cup-shaped member of magnetic material within said shell and defining an air gap therewith, a coil surrounding said cup-shaped member, said cup-shaped member, shell and air gap defining a fixed reluctance magnetic path, and a tuning member of magnetic material adjustable through the shell and into said cup-shaped member adjacent the air gap therebetween, said tuning member defining a variable reluctance shunt magnetic path around said air gap in said fixed reluctance magnetic path.

3. An inductance device comprising a shell of magnetic material, a cup-shaped member of magnetic material affixed within said shell, a coil surrounding said cup-shaped member, said cup-shaped member having a rim portion, said rim portion in close abutment to and defining an air gap with the internal surface of said shell, said cup-shaped member, shell, an air gap defining a fixed reluctance magnetic path, and a tuning member of magnetic material adjustable into said cup-shaped member, said tuning member defining a variable area shunt magnetic path around said air gap in said fixed reluctance magnetic path.

4. An inductance device comprising a shell of magnetic material, a cup-shaped member of magnetic material within said shell, a coil surrounding said cup-shaped member, said cup-shaped member having a rim portion, said rim portion in directly opposed spaced relation and defining a first air gap with the internal surface of said shell, said cup-shaped member, shell and air gap defining a fixed reluctance magnetic path, and a tuning member of magnetic material adjustable adjacent said shell and into said cup-shaped member, said tuning member defining a second air gap with said shell and a third air gap with said cup-shaped member, said tuning member and air gaps defined therewith comprising a shunt magnetic path in parallel with said fixed relutcance magnetic path.

5. An inductance device comprising a shell of magnetic material, a cup-shaped member of magnetic material contained within said shell, a coil surrounding said cup-shaped member, said cup-shaped member having a rim portion, said rim portion defining a first air gap with the internal surface of said shell, said cup-shaped member, shell and air gap constituting a fixed reluctance magnetic path, and a cylindrical tuning member of magnetic material adjustable adjacent said shell and into said cup-shaped member, said tuning member defining a second air gap of fixed reluctance with said shell and a third air gap of variable reluctance with said cup-shaped member, said tuning member, second and third air gaps defining a shunt magnetic path around said first air gap.

6. An inductance device comprising a hollow casing of magnetic material, a post of magnetic material having a recess therein contained within said hollow casing, a coil on said post, a rim portion on said post surrounding said recess, said rim portion and inner surface of said hollow casing defining a first air gap, said hollow casing, post and first air gap constituting a fixed reluctance magnetic path, and a tuning member of magnetic material adjustable into said recess in a direction parallel to the length of said first air gap and adjacent thereto, said tuning member defining a second air gap of fixed reluctance with said hollow casing and a third air gap with said post, said third air gap being of substantially fixed length and of area which varies directly with the position of said tuning member.

7. An inductance device in accordance with claim 6 in which said tuning member is adjustable for a distance greater than the length of said first air gap whereby magnetic flux is gradually shunted through said tuning member to vary the inductance of said inductance device.

8. An inductor comprising a shell of magnetic material having an aperture therein, a post of magnetic material affixed within said shell, a coil within said shell surrounding said post, said post having a cup-shaped depression therein adjacent to said aperture and a rim portion defined by said depression, said rim portion defining a first air gap with said shell, a tuning member of magnetic material extending through said aperture and insertable into said cup-shaped depression in a direction parallel to the length of said first air gap and at a substantially constant distance therefrom whereby magnetic flux from said air gap is shunted through said tuning member to vary the inductance of the inductor.

9. An inductor comprising a cylindrical shell of magnetic material having an aperture in one end, a post of magnetic material axially aligned within said cylindrical shell, a coil surrounding said post, said post having a cup-shaped depression in one end adjacent said aperture and a rim portion defined by said depression, said rim portion and the inner shell surface surrounding said aperture defining an air gap of fixed length, and a tuning member of magnetic material extending through said aperture and adjustable into said cup-shaped depression whereby the magnetic flux from said air gap may be shunted through said tuning member.

10. An inductor in accordance with claim 9 in which the radius of said post is between 0.4 and 0.5 of the radius of said cylindrical shell and the height of said cylindrical shell is between 1.0 and 1.25 of the radius of said cylindrical shell.

11. An inductor in accordance with claim 9 in which the radius of said post is substantially 0.45 of the radius of said cylindrical shell and the height of said cylindrical shell is substantially 1.10 of the radius of said cylindrical shell.

References Cited in the file of this patent

UNITED STATES PATENTS

| | | |
|---|---|---|
| 2,018,626 | Polydoroff | Oct. 22, 1935 |
| 2,439,277 | Walker | Apr. 6, 1948 |
| 2,451,026 | Friend | Oct. 12, 1948 |
| 2,483,900 | Hardenberg | Oct. 4, 1949 |

FOREIGN PATENTS

| | | |
|---|---|---|
| 479,880 | Great Britain | Feb. 14, 1938 |